(12) United States Patent
White

(10) Patent No.: US 6,986,191 B2
(45) Date of Patent: Jan. 17, 2006

(54) BOLSTER PLATE ASSEMBLY

(75) Inventor: Joseph M White, Windsor, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/882,434

(22) Filed: Jul. 1, 2004

(65) Prior Publication Data

US 2004/0244189 A1    Dec. 9, 2004

Related U.S. Application Data

(62) Division of application No. 09/918,764, filed on Jul. 30, 2001, now Pat. No. 6,789,312.

(51) Int. Cl.
*B25B 27/14* (2006.01)
(52) U.S. Cl. .................. 29/281.6; 29/832; 29/830; 29/739; 29/740; 29/281.1; 29/281.4; 29/281.5; 439/21; 439/24; 439/66

(58) Field of Classification Search .................. 29/832, 29/825, 830, 739, 740, 281.1, 281.4, 281.5, 29/281.6; 439/21, 24, 66, 91, 74, 71, 1, 75, 439/581
See application file for complete search history.

(56) References Cited

U.S. PATENT DOCUMENTS 6,658,729 B2 * 12/2003 Brodsky ...................... 29/832

* cited by examiner

*Primary Examiner*—Richard Chang

(57) ABSTRACT

A bolster plate is attached to a printed circuit board and acts as a stiffener that reduces bending in the overall assembly during the attachment of an integrated circuit chip to the printed circuit board under a heavy applied load. The bolster plate is provided with a shim that compensates for bending of the bolster plate under load, thereby preventing damage to the integrated circuit chip. The dimensions of the shim may be selected according to computer model results representing bow deformation in the bolster plate without the shim.

8 Claims, 5 Drawing Sheets

BOLSTER PLATE ASSEMBLY

RELATED APPLICATIONS

This application is a divisional of U.S. patent Ser. No. 09/918,764, filed Jul. 30, 2001, now U.S. Pat. No. 6,789,312 entitled A METHOD OF ATTACHING AN INTEGRATED CIRCUIT TO A CHIP MOUNTING RECEPTACLE IN A PCB WITH A BOLSTER PLATE, the aforementioned application is incorporated herein by reference thereto.

BACKGROUND OF THE INVENTION

1. Field of the Invention

The invention pertains to the field of electrical equipment manufacture and, particularly, the electrical attachment of integrated circuit chips, such as microprocessors and application-specific integrated circuits (ASICS), to printed circuit boards. More specifically, the method of attachment uses a bolster plate to reinforce the printed circuit board during the attachment process.

2. Discussion of the Related Art

A variety of methods have been devised for the attachment of integrated circuit chips, such as microprocessors and ASCIS, to printed circuit boards in a manner that assures consistency in establishing good electrical contact. Many of these methods involve the use of high compressive loads, which are applied to the processors. The integrated circuit chips typically have a plurality of pins that mate with a corresponding female conductive receptacle in the printed circuit board. The printed circuit boards, alone, lack sufficient rigidity to support the compressive loads during attachment. For example, these loads may range from two hundred to three hundred pounds force (890 to 1300 Newtons). Resultant bending of the printed circuit board is capable of damaging wiring or other materials within the integrated circuit chip. Additionally, the bending moment is capable of disrupting the desired electrical contact.

The problem of printed circuit board bending under these heavy loads is typically resolved by using a bolster plate, which is a piece of metal that attaches to the printed circuit board, e.g., by bolting, riveting, or adhesion. The bolster plate may be constructed in any geometrical shape that provides the requisite support. The bolster plate is usually located on the reverse side of the printed circuit board opposite that side on which the integrated circuit chip resides.

Newer microprocessors and ASICS devices have increased numbers of pins in comparison to older devices. Furthermore, the newer devices operate at much higher speeds than did older devices. The increasing number of pins and higher levels of performance demand closer mechanical tolerances for manufacturing purposes. It has been discovered that the use of a bolster plate according to traditional practices does not sufficiently eliminate the bending moment in the printed circuit boards in light of these new demands. In applications where, for example, a force of 270 pounds (1200 Newtons) is applied to seat a microprocessor, a conventional bolster plate may bow a distance of 0.001 inch (0.0025 cm). Even this small amount of bending is sufficient damage the assembly or to cause failure in the electrical contact.

The bolster bow or bend is at maximum in the center of the bolster plate. Additional rigidity could be imparted by increasing the thickness of the bolster plate, but this requires additional room for the bolster plate. The increased thickness creates other difficulties in the context of fitting additional components on the printed circuit board and in assembling adjacent components in the intended use environment. Attempts have been made to pre-bow or pre-stress the bolster plate to accommodate the stress during the attachment of microprocessors, but the resulting bending moment from pre-stressing the bolster plate was not repeatable.

There remains a problem in preventing bolster plate bending due to the insertion of newer microprocessors and ASICS devices.

SUMMARY OF THE INVENTION

A bolster plate according to the principles described herein overcomes the problems described above and advances the art by providing a method, apparatus and software pertaining to a shim or shim assembly that compensates the bolster plate for bending deformations during the attachment of integrated circuit chips. The shim may be located, for example, at a position where the maximum amount of deformation occurs under load from the attachment process. Thus, the shim substantially fills the deformation under load and prevents damage to the microprocessor by providing support to the assembly preventing corresponding deformation in the integrated circuit chip, notably, in the pins, wiring and silicon, which are subject to breakage under small amounts of deformation.

A bolster plate according to these principles is used for supporting a printed circuit board during attachment of an integrated circuit chip to the printed circuit board. The bolster plate comprises a support rail presenting a contact face for use in contacting the printed circuit board. The rail demarcates a central well that contains a platform presenting a support surface configured to support a selected portion of the printed circuit board underneath the integrated circuit chip during attachment of the integrated circuit chip to the printed circuit board. Where the bolster plate is made out of a metal, an insulator preferably covers the support surface. A shim is interposed between the insulator and the support surface where the insulator is required to prevent short circuiting of the integrated circuit chip. With or without the insulator, the shim is positioned at a point or points of maximum deformation in the bolster plate. The dimensions of the shim are preselected to compensate for deformation of the bolster plate under the design load by filling the point or points of maximum deformation.

While the dimensions of the shim may be determined by trial and error, a much preferred manner of determining the shim dimensions is to calculate, e.g., through finite element mathematical modeling, the predetermined dimensions that are operable to compensate for bending of the bolster plate under a maximum applied load during attachment of the integrated circuit chip. This modeling assures that the deformed support surface under load is shim-compensated to present a total deformation of less than, for example, a 0.001 inch or 0.0005 inch (0.0025 or 0.0038 cm) bow at a center of the bolster plate under the maximum applied load. The term "finite element modeling" is hereby defined to include both finite analysis and finite difference modeling techniques.

The shim may have any geometrical shape, such as a square or rectangular shape, but a disk or ovaloid shape is preferred for correspondence with the shape of bow deformation in the bolster plate. Particularly preferred shims comprise a plurality of pieces, such as two disks, where the pieces have different dimensions and are concentrically stacked to present a stair-stepped edge providing a transition to the support surface that is less abrupt than a non-tapered shim. Alternatively, a single shim may be tapered or machined to have a stair-step, in order to ease the transition.

The bolster plate that is described above may be used in a method of attaching an integrated circuit chip to a chip-mounting receptacle in a printed circuit board. The method comprises the steps of assembling a bolster plate including the shim, attaching the bolster plate to the printed circuit board; and pressing the integrated circuit chip into the chip mounting receptacle. Further method steps preferably but optionally comprises modeling a bending moment in the bolster plate under a maximum applied load for use in the step of pressing the integrated circuit chip to provide model results for shim-based compensation of the bending moment, and selecting dimensions of the shim based upon the model results.

The principles described herein also pertain to a computer readable form comprising machine instructions that are operable for determining a bow deformation in the bolster plate when the bolster plate is placed under a maximum load during attachment of an integrated circuit chip, and identifying dimensions for the shim that may be used to compensate for the bow deformation. In a manufacturing environment, permits the selective adjustment of shim dimensions to compensate for bow deformation on the basis of different bolster plate designs and materials, as well as different applied loads. If an increase in device failure rate is traceable to the chip attachment process, the shim dimensions can be selectively adjusted to overcome the observed failure increases.

DETAILED DESCRIPTION OF THE EMBODIMENTS

There will now be shown by way of example and not by limitation, a bolster plate in use for supporting a printed circuit board during attachment of an integrated circuit chip to the printed circuit board. The bolster plate comprises a support rail presenting a contact face for use in contacting the printed circuit board. The rail demarcates a central well that contains a support surface configured to support a selected portion of the printed circuit board underneath the integrated circuit chip during attachment of the integrated circuit chip to the printed circuit board.

Figure 1:
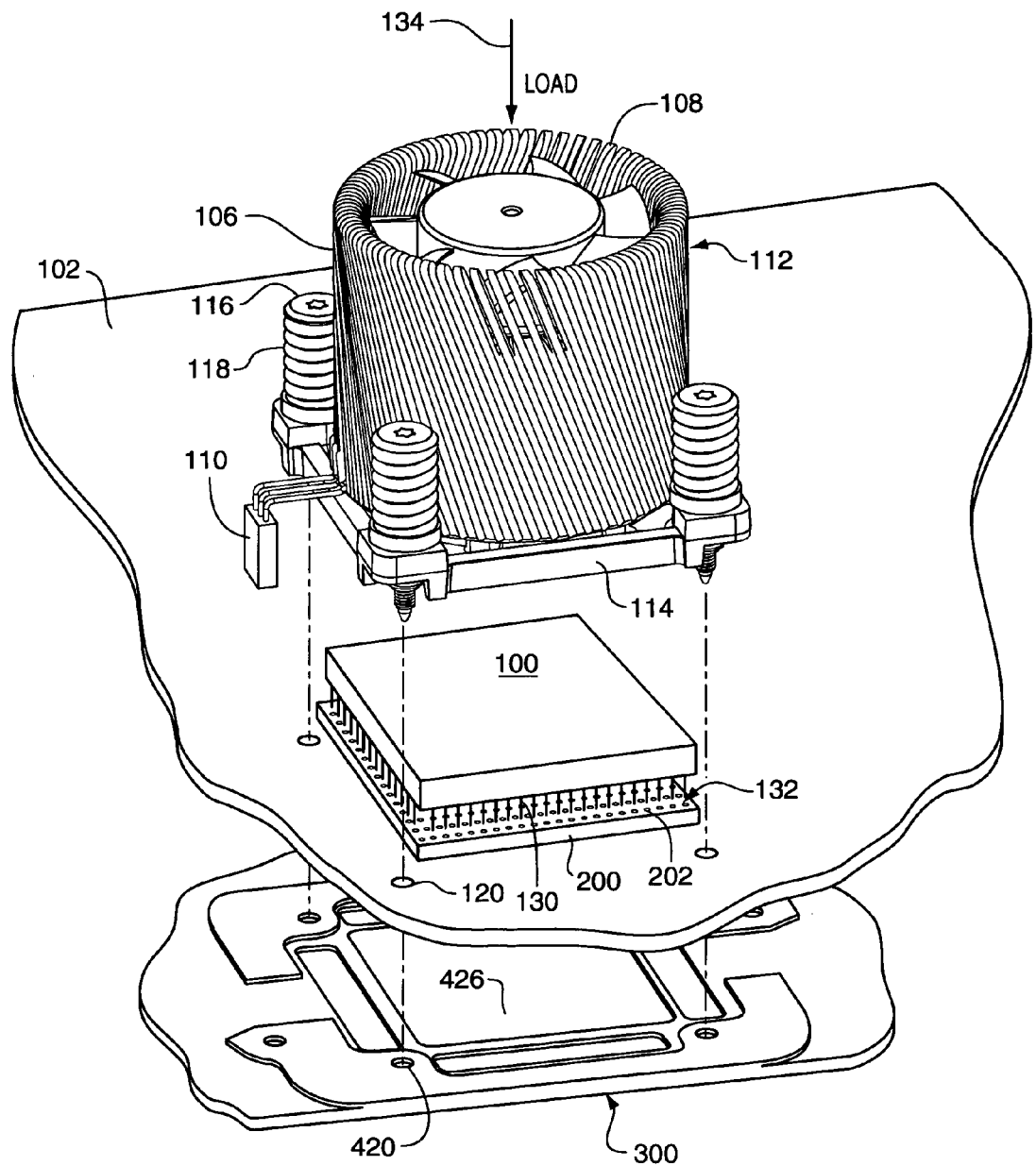
FIG. 1 is an assembly view depicting attachment of a microprocessor to a printed circuit board with use of a bolster plate.

FIG. 1 is an assembly view showing an integrated circuit chip 100, e.g., a microprocessor, that is being attached to a printed circuit board 102 by insertion into a chip socket 200. A heat sink assembly 106 comprises a central electric fan 108 with a corresponding power coupling 110, and well as heat-conductive fins 112. A square base plate 114 at each corner contains a shoulder screw, such as screw 116, that is circumscribed by a compression spring, such as compression spring 118.

The shoulder screws, e.g., shoulder screw 116, are each inserted into corresponding holes 120, as well as threaded apertures, such as aperture 420, in a bolster plate 300 that underlies the printed circuit board 102. The heat sink assembly is lowered until the base plate 114 contacts integrated circuit chip 100. Pins 130 are aligned with corresponding receptacles 132. Gradual balanced tightening of the shoulder screws into the bolster plate 300, e.g., as shoulder screw 116 is extended through hole 120 and threaded into threaded aperture 420, then forces the pins 130 fully into receptacles 132. The compression springs, e.g., compression spring 118, are calibrated to place a uniform, permanent predetermined compressive load 134 on base plate 114 and integrated circuit chip 100 once the shoulder screws are fully and equally tightened. This load 134 may, for example, in combination from all of the compression springs range from 200 to 500 pounds force, and a load of 270 pounds is preferred for the attachment of microprocessors.

Figure 2:
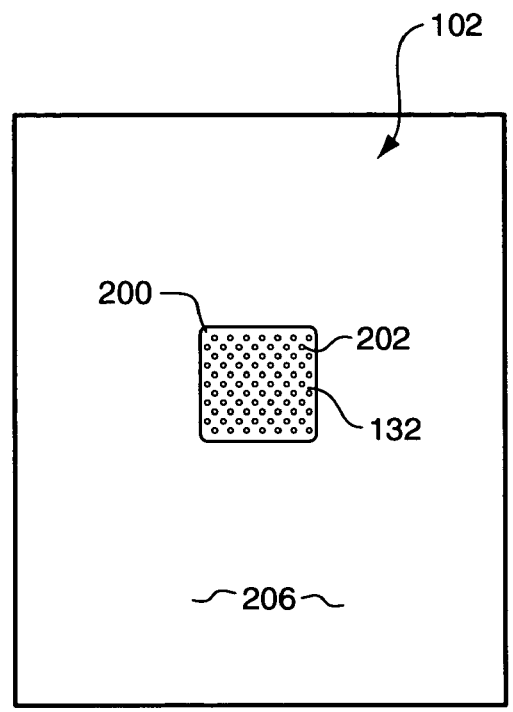
FIG. 2 is a top side view of a printed circuit board having a chip-mounting receptacle.

FIG. 2 provides additional detail with respect to the printed circuit board 102 shown in FIG. 1. FIG. 2 is a top side view of printed circuit board 102 having the chip-mounting socket 200 comprising a plurality of female pin receptacles 202, such as receptacle 132. A top face 206 may contain any feature of printed circuit boards that facilitate design operations of the printed circuit board 102. FIG. 2 does not show these features in detail, but they may include, for example, resistors, capacitors, inductors, additional integrated circuit devices, buses, and metalized pathways that establish communication between these components.

Figure 3:
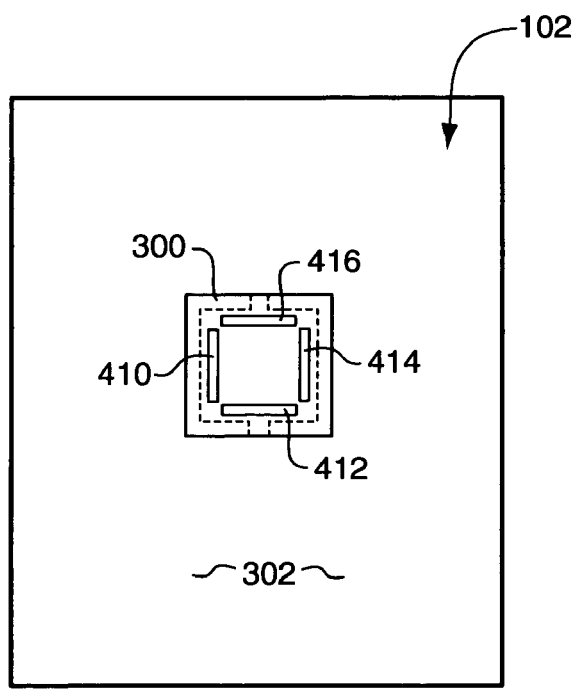
FIG. 3 is a bottom side view of the printed circuit board shown in FIG. 2, and shows a bolster plate installed underneath the chip-mounting receptacle.

FIG. 3 provides additional detail with respect to the printed circuit board 102 shown in FIG. 1. FIG. 3 is a bottom side view of the printed circuit board 102, and shows a bolster plate 300 installed underneath the chip-mounting socket 200 (shown in phantom). A bottom face 302 may optionally contain any feature of printed circuit boards that facilitate design operations of the printed circuit board 102. FIG. 3 does not show these features in detail, but they may include, for example, resistors, capacitors, inductors, additional integrated circuit devices, buses, and metalized pathways that establish communication between these components. The use of a dual-sided board including a bottom face 302 with these features installed increases the density of printed circuit board 102.

Figure 4:
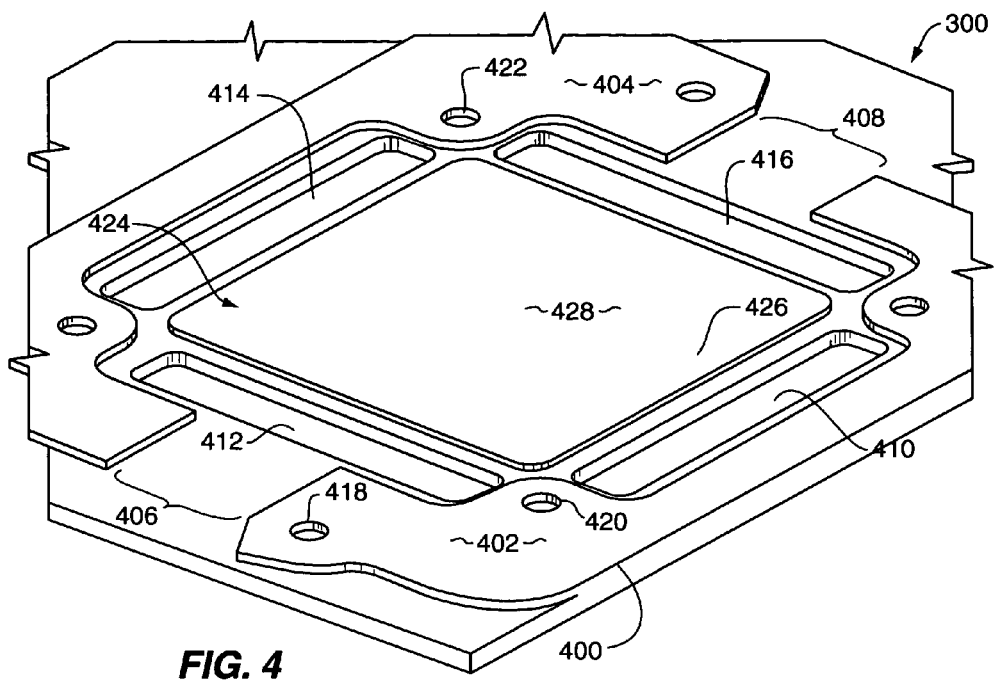
FIG. 4 is a top perspective view of a bolster plate providing additional detail with respect to the bolster plate shown in FIG. 3.

FIG. 4 provides additional detail with respect to the bolster plate 300 shown in FIG. 3. The bolster plate 300 is preferably stamped from a single piece of metal to form rail 400 presenting flat contact surfaces 402 and 404 that is adapted to fit flush against the bottom face 302 (see FIG. 3) of printed circuit board 102. The rail 400 may be discontinuous to present a plurality of flat contact surfaces, such as surfaces 402 and 404. Discontinuities, such as discontinuities 406 and 408 in the rail 400 may be provided as a mater of design choice to permit the passage of metalization layers, electrically conductive leads, or other components on the printed circuit board (not shown) without interference from the bolster plate 300. The bolster plate 300 may also contain cavities, such as cavities 410, 412, 414, and 416, as needed to permit the passage of components mounted on the printed circuit boards, such as selected bottom side portions of the pin mounting socket 200 (see also FIGS. 2 and 3). The rail 400 comprises a plurality of apertures, such as apertures 418, 420, and 422, which may be used to bolt or rivet the bolster plate 300 to the printed circuit board 102, as shown in FIGS. 1.

The rail 400 substantially circumscribes a central square well 424, which contains a microprocessor support platform 426 presenting a support surface 428. The support surface 428 is typically lower than the contact surfaces 402 and 404 (as shown in FIG. 4), but may occupy the same elevation as or be higher than the contact surfaces 402 and 404.

The bolster plate 300, as shown and described to this point, may be any type of bolster plate for use on printed circuit boards. The dimensions and structure of the bolster plate 300 may be any dimensions and structure, as may be desired according to design choice. The specific geometry of the bolster plate 300 is not necessarily critical, except that the bolster plate must compliment the printed circuit board 102 for mounting purposes and should have sufficient strength to fulfill its purposes.

There will now be shown a modification to bolster plate 300, according to the preferred instrumentalities described herein, to enhance the utility of bolster plate 300 by using a shim to facilitate improved support to a printed circuit board during attachment of an integrated circuit chip to the printed circuit board. The bolster plate comprises a support rail presenting a contact face for use in contacting the printed circuit board. The rail demarcates a central well that contains a support surface configured to support a selected portion of the printed circuit board underneath the integrated circuit chip during attachment of the integrated circuit chip to the printed circuit board. Where the bolster plate is made out of a metal, an insulator covers the support surface. The shim is interposed between the insulator and the support surface.

Figure 5:
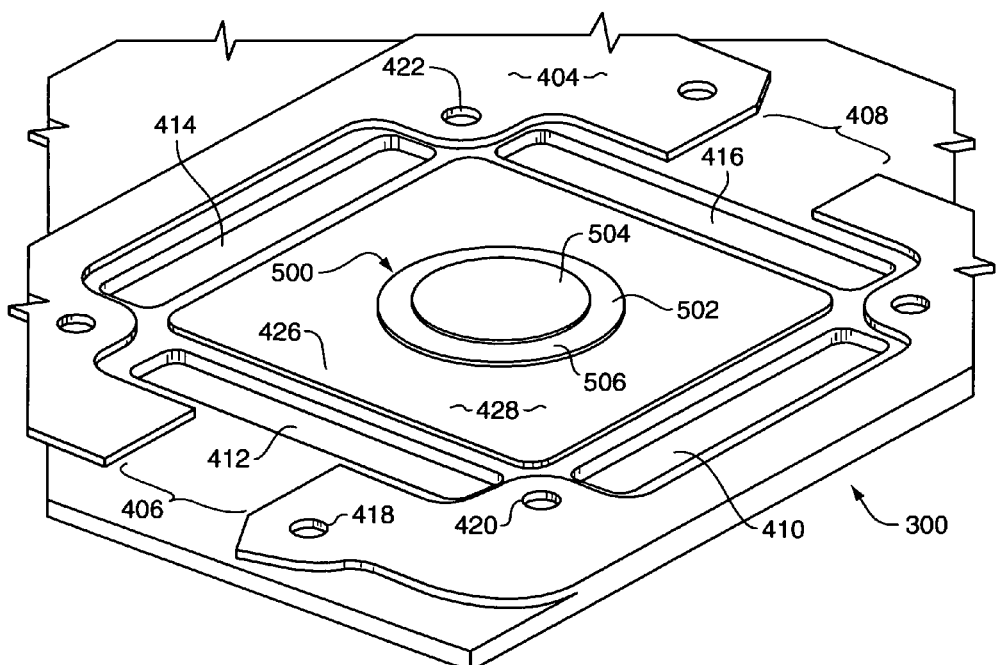
FIG. 5 is a top perspective view of the bolster plate from FIG. 4, further including a shim placed in the center of a support surface.

FIG. 5 depicts the bolster plate 300, exactly as shown and described in FIG. 4, with the addition of a shim 500 that is centrally located with respect to support surface 428. The shim 500 may have any geometrical shape, such as a square, rectangle, triangle, or combination of shapes, such as a square or triangle with rounded corners. The optimum dimensions of the shim 500, such as width, length, and thickness, are preferably determined by finite element modeling of the bending moment in bolster plate 300, as described below in additional detail.

As shown in FIG. 5, shim 500 comprises two separate disks 502 and 504. Disk 502 is in direct contact with support surface 428, and disk 504 resides concentrically above disk 502. Disk 504 has a smaller diameter than does disk 502, which presents a stair-step 506 or taper in progression downward from disk 504 to disk 502 and support surface 428. Alternatively, a single-piece shim 500 may be used, additional disks of increasingly smaller diameter may be stacked atop disk 504, or a single tapered disk may be used. The disks 502 and 504 may be coated with adhesive on one or both sides to enhance their positional stability during the assembly process.

Figure 6:
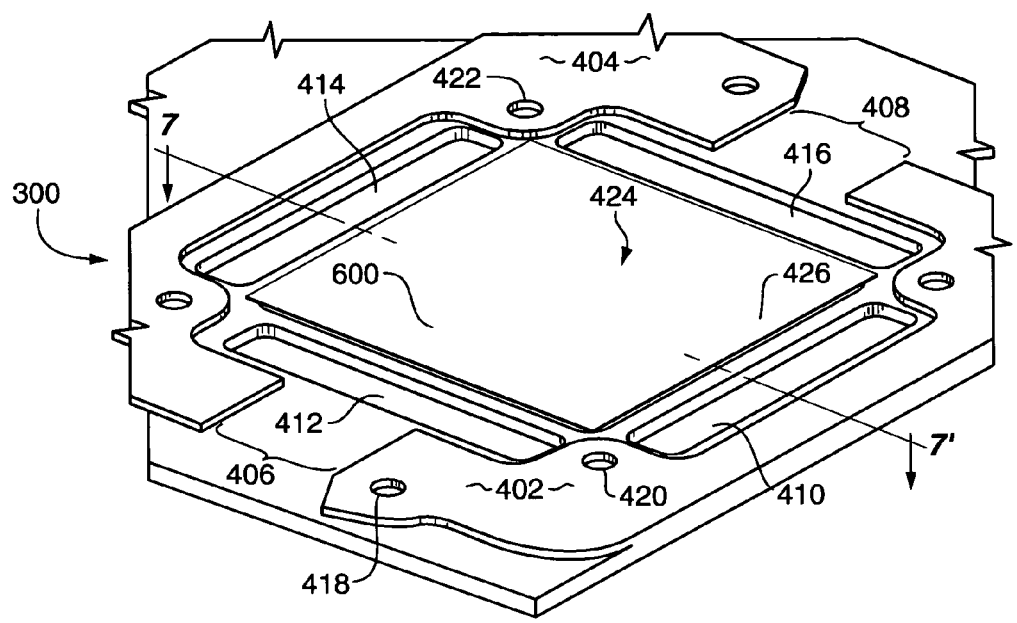
FIG. 6 is a top perspective view of the bolster plate shown in FIG. 5 after installation of an insulating layer to cover the shim and the support surface.

FIG. 6 depicts the bolster plate 300 in final assembly as it is made-ready for attachment to a printed circuit board (not shown). The bolster plate 300, as shown in FIG. 6, is identical to the bolster plate 300 as shown in FIG. 5, except a square insulator 600, preferably but optionally with adhesive backing, has been placed in well 424 to cover the shim 500 and support surface 428.

Figure 7:
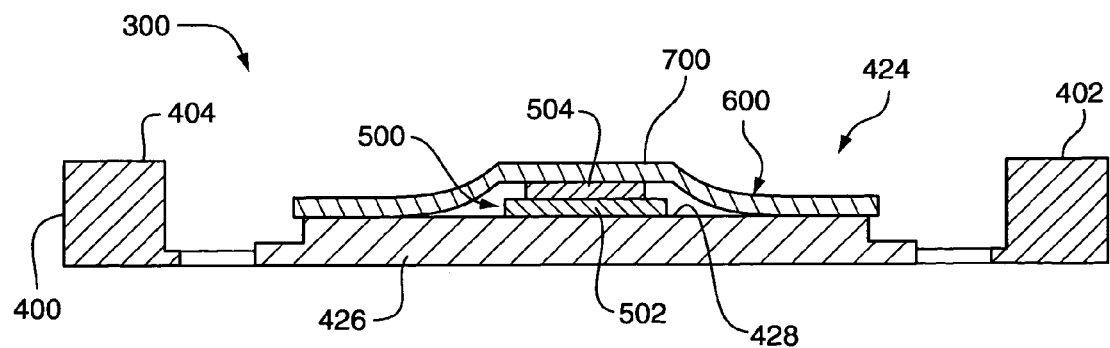
FIG. 7 is a midsectional view of the bolster plate in unstressed condition taken along line 7–7' of FIG. 6.

FIG. 7 is a midsectional view taken along line 7–7' of FIG. 6. The scale of FIG. 7 is exaggerated to show relatively increased thicknesses of the insulator 600 and the shim 500 relative to other components. As shown in FIG. 7, the bolster plate 300 is in an unstressed state where the shim 500 causes a bulge 700 to form in the middle of well 424.

Figure 8:
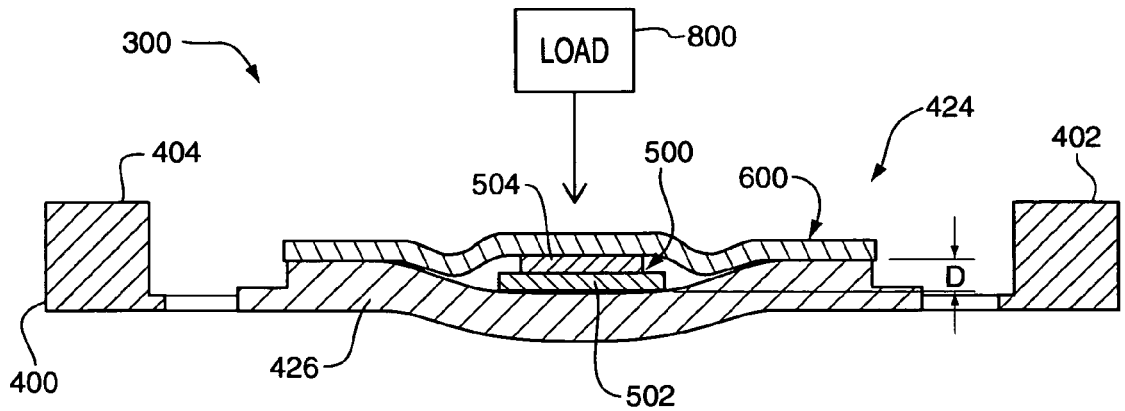
FIG. 8 depicts the bolster plate midsectional view of FIG. 7 under a heavy applied load.

FIG. 8 depicts the bolster plate 300 along the same midsectional view shown in FIG. 7, however, the bolster plate 300 as shown in FIG. 8 is stressed by loading conditions, such as may be imposed by a maximum applied load during use of the assembly shown in FIG. 1. A maximum applied load 800 has induced a bending moment in the support platform 426, such that the bulge 700 of FIG. 7 has been substantially eliminated to present a flat surface. The bending moment causes buckling or deformation of vertical magnitude D, which is the approximate thickness of the shim 500. Where the magnitude of D is, for example, 0.001 inches, the availability of shim 500 reduces the magnitude of such buckling presented at surface 428 to a value less than 0.001 inches under the static or dynamic loading conditions that are imposed by the maximum applied load 800. Due to the relatively small thickness of shim 500, it does not matter whether support platform is transiently or permanently deformed by the maximum applied load 800.

The dimensions of shim 500 vary depending upon the dimensions of bolster plate 300 and the magnitude of applied load 800. The bolster plate 300 may be any bolster plate that is designed for the support of any integrated circuit chip. Accordingly, no one set of dimensions in shim 500 can be used to accommodate all applications. The deformation in bolster plate 300 may be observed by physical measurements without the shim 500 attached. The deformation may also be modeled by finite element or finite difference techniques based upon the actual dimensions and materials that are used in bolster plate 300. The dimensions of shim 500 may also be adjusted based upon experience-in-use factors. If, for example, manufacturing processes result in failures of integrated circuit chips due to breakage that is induced by the installation process, the dimensions of the shim 500 may be adjusted to provide more or less support in the area of breakage depending upon the nature of the breakage.

Along these lines, it should be noted that the dimensions of support table 426 are preselected as a matter of design choice in designing a conventional bolster plate. Designers, in choosing the dimensions structures like platform 426 and rail 400, normally intend to support a corresponding area underlying a selected portion of the overlying pin mounting receptacle 200, printed circuit board 102 and base plate 114, that is selected in the judgment of such designers as being needful of support. Some circumstances may arise where the observed or modeled deformation in bolster plate 300 is difficult to compensate with a shim 500 due to complex geometrical constructions and alignment of parts. In these circumstances, a bolster plates may be designed to provide a less complex deformation that can be easily compensated through use for a shim 500.

Figure 9:
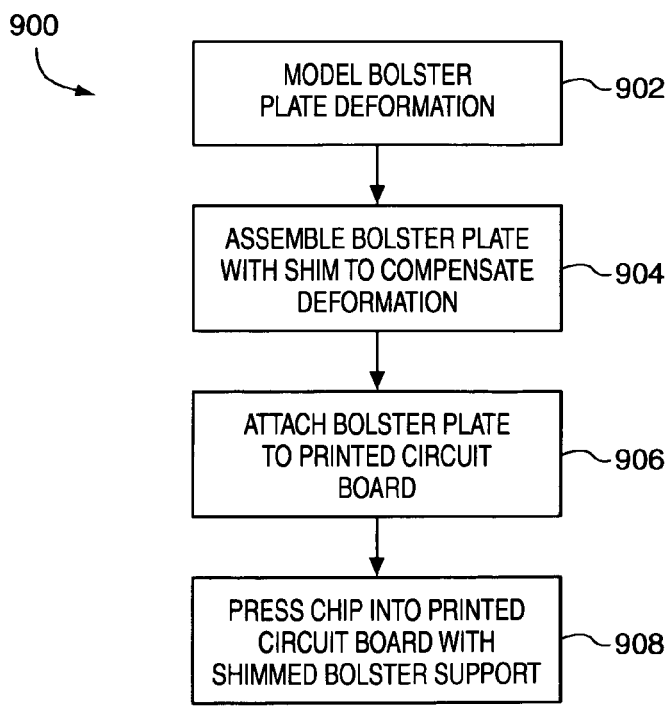
FIG. 9 depicts a process diagram for use in attaching an integrated circuit chip to a printed circuit board with use of the bolster plate.

FIG. 9 is a process schematic diagram illustrating a preferred method 900 for attaching an integrated circuit chip to a chip-mounting receptacle in a printed circuit board with use of a bolster plate to support the printed circuit board. The method begins in step 902 with the modeling of bolster plate deformation under an applied load. A variety of commercially available finite element modeling packages may be used for this purpose. Two such commercially available finite element modeling programs that are particularly preferred for use in modeling the deformation of bolster plates, such as bolster plate 300, include MECHANICA® and Pro/MECHANICA®, both of which are produced by Parametric Technology Corporation of Waltham, Mass. Other packages, such as RASNA®, formerly produced by Rasna Corporation of San Jose, Calif., and a variety of other packages may also be programmed with data to model such deformations. The dimensions of the shim, such as shim 500, are intended to compensate for the modeled deformations by filling the point or points of maximum deformation under the maximum applied load, as shown in FIG. 8.

Step 904 entails assembling the bolster plate, as shown for bolster plate 300 in the context of FIGS. 3 through 6. The assembly, for example, as described above, preferably includes a rail 400 that provides a face 402, 404 for use in contacting the printed circuit board 102. The rail also demarcates a central well 424. The central well contains a support surface 428 configured to support a selected portion of the printed circuit board underneath the integrated circuit chip during attachment of the integrated circuit chip to the printed circuit board. An insulator 600 covers the support surface 428. A shim 500 embodies dimensions corresponding to the model results of step 902 and is interposed between the insulator and the support surface.

Step 906 includes attaching the bolster plate to the printed circuit board by any conventional means, such as bolting, riveting or adhesion. Step 908 includes pressing the integrated circuit chip into the chip mounting receptacle, e.g., as shown in FIG. 1.

Another aspect of the preferred instrumentalities described herein pertains to a computer readable form comprising machine instructions. The instructions are operable for determining a bow deformation in a bolster plate when the bolster plate is placed under a maximum load during attachment of an integrated circuit chip, and identifying dimensions for a shim that may be used to compensate for the bow deformation. This type of computer readable form may comprise a data file or object containing data and program instructions in combination with one of the commercially available finite element modeling packages described above in the context of step 902, as shown in FIG. 9. The program instructions may, for example, include instructions for the formation of a grid that is useful for finite element modeling, materials information, dimensions of the bolster plate, and iteration/convergence criteria.

The foregoing discussion is intended to illustrate the concepts of the invention by way of example with emphasis upon the preferred embodiments and instrumentalities. Accordingly, the disclosed embodiments and instrumentalities are not exhaustive of all options or mannerisms for practicing the disclosed principles of the invention. The inventor hereby states his intention to rely upon the Doctrine of Equivalents in protecting the full scope and spirit of the invention.

I claim:

1. A bolster plate assembly for use in supporting a printed circuit board during attachment of an integrated circuit chip to the printed circuit board, comprising:
    a support rail presenting a contact face for use in contacting the printed circuit board;
    the rail demarcating a central well;
    the central well containing a support surface configured to support a selected area underneath the integrated circuit chip during attachment of the integrated circuit chip to the printed circuit board;
    an insulator covering the support surface; and
    a shim interposed between the insulator and the support surface,
    the shim contacting the support surface to receive support therefrom against compressive loading on the insulator.

2. The bolster plate assembly of claim 1, wherein the shim has predetermined dimensions providing means for compensating for bending of the bolster plate under a maximum applied load during attachment of the integrated circuit chip to the printed circuit board.

3. The bolster plate assembly of claim 2, wherein the predetermined dimensions are provided according to a process of finite element modeling of bending characteristics of the bolster plate under the maximum applied load.

4. The bolster plate assembly of claim 3, wherein the predetermined dimensions are sufficient to impart less that 0.001 inch bow at a center of the bolster plate under the maximum applied load.

5. The bolster plate assembly of claim 3, wherein the predetermined dimensions are sufficient to impart less that 0.0005 inch bow at a center of the bolster plate under the maximum applied load.

6. The bolster plate assembly of claim 1, wherein the shim comprises a disk.

7. The bolster plate assembly of claim 1, wherein the shim comprises at least two different pieces of different dimensions.

8. The bolster plate assembly of claim 1, further comprising the integrated circuit chip and the printed circuit board assembled to the bolster plate.

* * * * *